United States Patent
Sakurai et al.

(10) Patent No.: US 10,790,004 B2
(45) Date of Patent: Sep. 29, 2020

(54) APPARATUSES AND METHODS FOR MULTI-BANK AND MULTI-PUMP REFRESH OPERATIONS

(71) Applicant: Micron Technology, Inc., Boise, ID (US)

(72) Inventors: Kiyotake Sakurai, Hino (JP); Takuya Nakanishi, Hino (JP); Shinji Bessho, Hachioji (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/218,194

(22) Filed: Dec. 12, 2018

(65) Prior Publication Data
US 2020/0194056 A1  Jun. 18, 2020

(51) Int. Cl.
*G11C 11/406* (2006.01)
*G11C 11/409* (2006.01)
*G11C 11/4091* (2006.01)

(52) U.S. Cl.
CPC .... *G11C 11/40618* (2013.01); *G11C 11/4091* (2013.01); *G11C 11/40626* (2013.01)

(58) Field of Classification Search
CPC ........ G11C 11/40608; G11C 11/40626; G11C 11/4091
See application file for complete search history.

(56) References Cited

U.S. PATENT DOCUMENTS

| 8,174,921 B2 | 5/2012 | Kim et al. |
| 2005/0243617 A1 | 11/2005 | Kang |
| 2006/0239098 A1* | 10/2006 | Sunaga ............... G11C 11/406 365/222 |
| 2011/0273948 A1 | 11/2011 | Okahiro et al. |
| 2017/0186481 A1 | 6/2017 | Oh et al. |
| 2019/0325944 A1* | 10/2019 | Nakaoka ............... G06F 3/0653 |

FOREIGN PATENT DOCUMENTS

KR  1020170112786  10/2017

OTHER PUBLICATIONS

JEDEC Standard LPDDR4: Refresh Command; JEDEC Standard No. 209-4B, p. 137-143.
International Search Report and Written Opinion dated Mar. 27, 2020 for PCT Application No. PCT/US2019/064464, 12 pgs.

* cited by examiner

Primary Examiner — Tri M Hoang
(74) Attorney, Agent, or Firm — Dorsey & Whitney LLP (57) ABSTRACT

Embodiments of the disclosure are drawn to apparatuses and methods for generating a refresh address locally at a memory bank. The memory bank may include or be associated with a bank logic circuit that latches an initial refresh address from a global row address bus for a first pump of a refresh operation. The bank logic circuit then updates the latched refresh address received to generate a new refresh address for a second pump of the refresh operation. A memory device may include multiple memory banks that share the global row address bus.

20 Claims, 9 Drawing Sheets

APPARATUSES AND METHODS FOR MULTI-BANK AND MULTI-PUMP REFRESH OPERATIONS

BACKGROUND

This disclosure relates generally to semiconductor devices, and more specifically to semiconductor memory devices. In particular, the disclosure relates to volatile memory, such as dynamic random access memory (DRAM). Volatile memory requires periodic refreshing of the data in the memory to preserve the data. Refresh operations may include multiple pumps, where one or more rows in a memory array are refreshed with each pump. As memory operations increase in speed, providing multi-pump refresh commands and associated refresh addresses for memory refresh operations may become more difficult.

DETAILED DESCRIPTION

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device, such as a DRAM device, may include multiple memory banks, each memory bank including one or more memory arrays. During memory operations (e.g., read, write, refresh), one or more memory addresses may be provided to a memory bank indicating the row and/or column of the memory array to be activated. The memory addresses may be provided via address buses. To avoid die-size increase, a row address bus is often shared by all memory banks in a memory device. This shared row address bus may be referred to as a global row address bus.

For a typical (e.g., regular) memory refresh operation, a row address is sent to one or more memory banks via the global row address bus for a per bank refresh operation (REFpb) or the row address is sent to all banks via the global address bus for an all bank refresh operation (REFab) when a refresh command is provided. Once the refresh address has been provided, addresses for subsequent memory commands (e.g., an activation command) may be provided on the global row address bus. However, for multi-pump refresh operations, one or more row addresses are provided on the global row address bus for each pump of the refresh operation. Providing the additional addresses on the global row address bus may require additional delay between memory commands to avoid conflicting row address data from appearing on the global row address bus. This additional delay between memory commands may reduce performance of the memory device.

Figure 1:
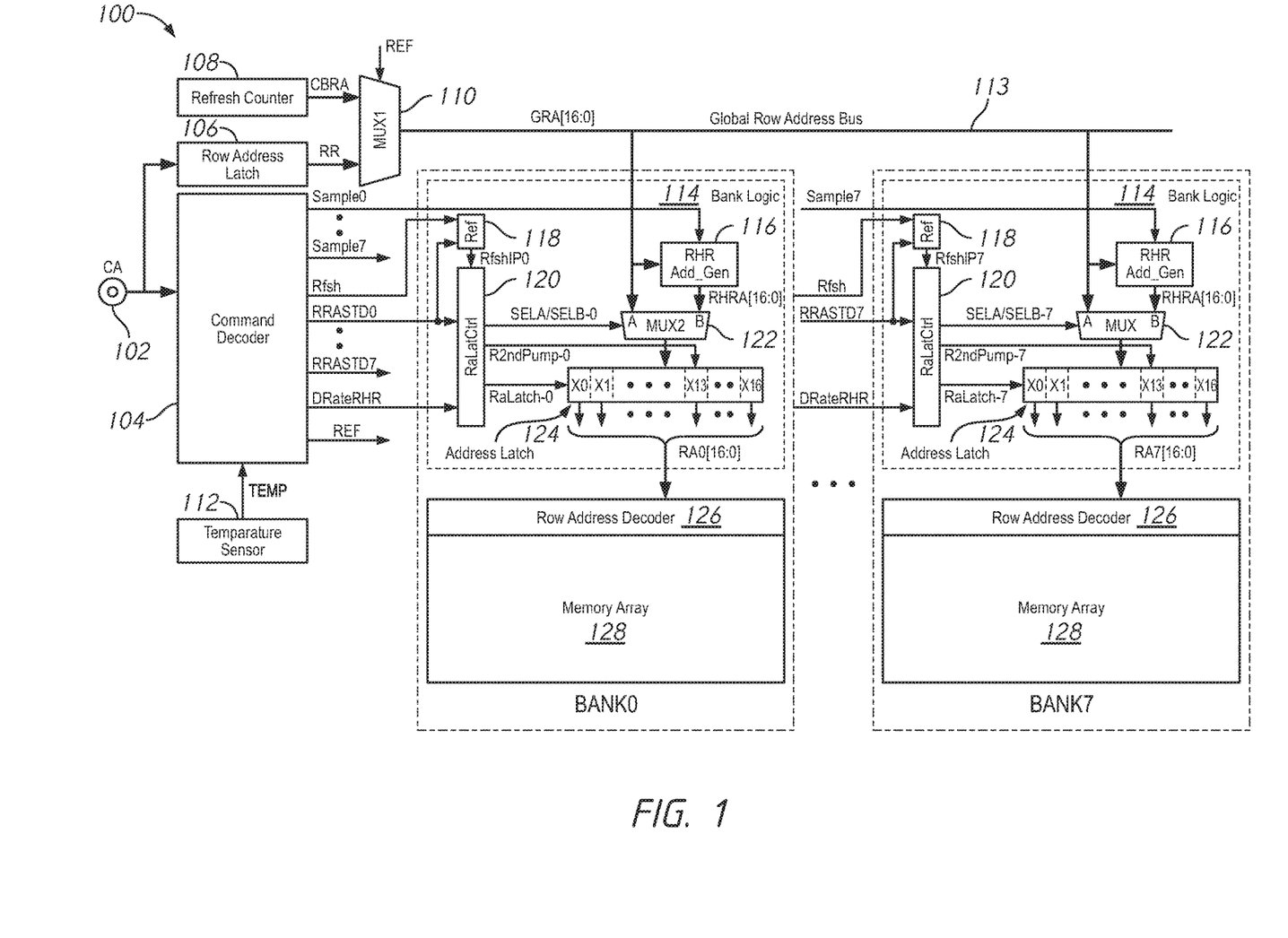
FIG. 1 is a schematic block diagram of a semiconductor device according to an embodiment of the disclosure.

FIG. 1 is a schematic block diagram of a semiconductor device 100 according to an embodiment of the disclosure. The semiconductor device 100 may include command address inputs (CA) 102, a command decoder 104, a row address latch 106, a refresh counter 108, a first multiplexer (MUM) 110, a temperature sensor 112, a global row address bus 113, and multiple memory banks (BANK0-7). Although the semiconductor device 100 includes eight memory banks, it is understood that semiconductor device 100 could include any number of memory banks (e.g., four, sixteen, thirty-two, etc.). For clarity, only BANK0 and BANK7 are illustrated in FIG. 1. Each memory bank BANK0-7 may include bank logic circuit 114. As described herein, the bank logic circuit 114 may allow one or more row addresses to be generated locally at the memory bank BANK0-7 during a refresh operation. The bank logic circuit 114 may include a row hammer refresh address generator circuit (RHR Add_Gen) 116, a refresh progress logic (Ref) circuit 118, a row address latch control logic (RaLatCtrl) circuit 120, a second multiplexer (MUX2) 122, and an address latch 124. Each memory bank BANK0-7 may include a row address decoder 126, and a memory array 128. Each memory array 128 may include a plurality of memory cells (not shown) organized in rows (e.g., word lines) and columns (e.g., bit lines) in some embodiments.

The CA 102 may receive commands and memory addresses associated with memory commands, such as memory refresh commands, provided by a device external to device 100, such as a memory controller. The memory addresses may include a row address, a column address, and/or a memory bank address. The CA 102 may provide (e.g., operatively convey) the commands and at least a memory bank address to a command decoder 104. The command decoder 104 may also receive a temperature signal (TEMP) from the temperature sensor 112. The temperature sensor 112 may sense the operating temperature of semiconductor device 100 to produce the TEMP signal. The TEMP signal may take a first logic state (e.g., high, "1") associated with a high temperature and may take a second logic state (e.g., low, "0") associated with a low temperature. In some embodiments, the TEMP signal may take three or more states to divide operating temperatures into three or more ranges. Based at least in part on the memory command, memory bank address, and TEMP signal, the command decoder 104 may produce a plurality of internal control signals including Sample0-7, Rfsh, RRASTD0-7, DRateRHR, and REF, as will be described in more detail below.

The row address latch 106 may receive a row address from the CA 102. The row address latch 106 may latch a row address associated with a memory command (e.g., activation command, read command, write command) and provide the latched row address as output signal RR.

The refresh counter 108 may generate a refresh address that designates a row address to be refreshed. Each time a refresh operation is completed on the row address, the refresh counter may be updated to generate an updated row address to be used during the next refresh operation. The refresh address may be provided as output signal CBRA.

MUX1 110 may receive RR from the row address latch 106 and CBRA from the refresh counter 108. The MUX1 110 may output RR or CBRA responsive to the REF signal from the command decoder 104. When the command decoder decodes a refresh command, the REF signal takes a first state (e.g., high, "1") to cause MUX1 110 to select and output CBRA. When the command decoder 104 decodes non-refresh commands (e.g., activation command, read command, write command), the REF signal takes a second state (e.g., low "0") to cause MUX1 110 to select and output RR. The output of MUX1 110 may be provided to the global row address bus as a global row address GRA[16:0]. As indicated by the [16:0] notation, the GRA may be a seventeen (17) bit address in some embodiments of the disclosure. Each memory bank BANK0-7 may be coupled to the global row address bus 113. The bank logic circuit 114 may receive the GRA from the global row address bus 113.

The GRA may be provided to the RHR Add_Gen 116. The RHR Add_Gen 116 generates a row hammer refresh address RI-MA[16:0] that designates a word line that is to be refreshed due to the "row hammer effect." The row hammer effect is caused by activating the same word line (i.e., by accessing the same row address) repeatedly in a successive manner. The repeatedly accessed word line may be referred to as an "aggressor word line." Word lines physically directly adjacent to the aggressor word line (e.g., the aggressor word line may be sandwiched between the two adjacent word lines) may be affected by the repeated activation/access of the aggressor line. These adjacent word lines may be referred to as "victim word lines." The repeated activating/accessing of the aggressor word line in a successive manner may cause data stored in memory cells of the victim word lines to deteriorate. Refresh operations additional to the regular refresh operations performed for normal memory operations may be required for victim word lines to prevent loss of data. These additional refresh operations outside the normal refresh operation cycle may be referred to as row hammer refresh operations. The row hammer refresh address RHRA may designate row addresses for one or more victim word lines to be refreshed during a row hammer refresh operation. That is, RHR Add_Gen 116 may generate multiple row addresses for output RHRA during a row hammer refresh operation. For example, RHR Add_Gen 116 may output a different row address for each pump of a refresh operation.

Increased densities of DRAM have led each memory cell to be physically smaller, resulting in storing smaller charges, lower operational noise margins, increased rates of electromagnetic interactions between the memory cells, and greater possibility of data loss. The row hammer effect may further deteriorate data stored in memory cells coupled to two word lines that are adjacent directly to the victim word lines. That is, the aggressor word line and the two victim word lines may be sandwiched between the other two word lines. These additional word lines may be referred to as "secondary victim word lines," and the word lines directly adjacent to the aggressor word line may be referred to as "primary victim word lines." In some embodiments, the RHRA may include a row address that designates at least one of a secondary victim word line in addition to a row address that designates at least one of a primary victim word line.

Still referring to FIG. 1, the command decoder 104 may provide control signals Sample0-7 to the corresponding RHR Add_Gen 116 of each memory bank BANK0-7. For example, the RHR Add_Gen 116 of BANK0 would receive Sample0, the RHR Add_Gen 116 of BANK1 would receive Sample1, and so on. The RHR Add_Gen 116 of each of BANK0-7 is coupled to the global row address bus 113. The RHR Add_Gen 116 of each bank BANK0-7 may sample the global row address bus 113 responsive to the assertion of an active state of a corresponding one of Sample0-7 signals provided by the command decoder 104. Each of the Sample0-7 signals may be asserted based on non-refresh memory commands (e.g., activation command, read command, write command), the non-refresh commands being used to access a memory array 128 of a corresponding one of memory banks BANK0-7. In other words, the non-refresh memory commands may be indicative of a row hammer operation on an aggressor word line, and additional refresh operations on primary and/or secondary victim word lines may be required. Based at least in part on sampling an address from the global row address bus 113, the RHR Add_Gen 116 may provide RHRA as an output, which as discussed above, may be addresses associated with one or more victim word lines.

The command decoder 104 may provide control signal Rfsh to the Ref circuit 118 of each memory bank BANK0-7. The command decoder 104 may further provide control signals RRASTD0-7 to the corresponding Ref circuit 118 of each memory bank BANK0-7, For example, the Ref circuit 118 of BANK0 would receive RRASTD0, the Ref circuit 118 of BANK1 would receive RRASTD1, and so on. In some embodiments, the Rfsh signal may be asserted (e.g., transitioned to an active state) in a one-shot pulse responsive to the command decoder 104 decoding a refresh command. That is, the Rfsh signal may transition to an active state for a limited time (e.g., one clock cycle, two clock cycles). Responsive to the active Rfsh signal, the Ref circuit 118 may check a state of a corresponding RRASTD signal (e.g., RRASTD0 for BANK0). If the RRASTD signal is an active state high, "1"), the Ref circuit 118 transitions an output control signal RfshIP to an active state e.g., high, "1"). The RRASTD signal may be transitioned to an active state by the command decoder 104 multiple times during a single refresh operation. The number of times the command decoder 104 transitions the RRASTD signal to an active state may be determined by a number of pumps included in the refresh operation. Any number of pumps may be performed during a refresh operation (e.g., two, three, four, etc.). The number of pumps may be indicated by a refresh command or it may be pre-set in the device 100.

The RaLatCtrl circuit 120 may be activated by an active RfshIP signal provided by the Ref circuit 118. Upon activation, the RaLatCtrl circuit 120 may provide control signals SELA/SELB, R2ndPump, and RaLatch. The states of the various control signals may be based, at least in part, on the corresponding RRASTD signal provided by the command decoder 104 to the memory bank (e.g., RRASTD1 for BANK1). The states of the various control signals of the RaLatCtrl circuit 120 may be further based, at least in part, on a DRateRHR signal provided by the command decoder 104. The DRateRHR signal may be provided to all memory banks BANK0-7. The DRateRHR signal maybe based on whether a regular refresh operation (CBRR) or a row hammer refresh operation (RHR) is performed during each pump of a refresh operation. As will be explained in more detail with reference to FIGS. 2A and 2B, a single refresh operation including multiple pumps may refresh a word line on each pump corresponding to a regular refresh operation (CBRR) based on the refresh counter 108, refresh a word line on each pump corresponding to the row hammer refresh operation (RHR) based on RHR Add_Gen 116, or some pumps may be part of a regular refresh operation while other pumps may be part of the row hammer refresh operation.

MUX2 122 may receive a refresh address GRA from the global row address bus 113 at input A and a row hammer refresh address RHRA from the RHR Add_Gen 116 at input B. The MUX2 122 may receive control signal SELA/SELB from RaLatCtrl circuit 120. In some embodiments, MUX2 122 may output GRA when SELA/SELB is at a high state and output RHRA when SELA/SELB is at a low state. The state of SELA/SELB may be based, at least in part, on a state of the DRateRHR signal provided by the command decoder 104 to the RaLatCtrl circuit 120. When DRateRHR is a first state (e.g., high), SELA/SELB may be set to the low state to select RHRA for a row hammer refresh operation. When DRateRHR is at a second state (e.g., low), SELA/SELB may be set to the high state to select GRA to perform a typical refresh operation.

The address latch 124 may receive an address (either GRA or RHRA) from MUX2 122. The address latch 124 may temporarily latch the address responsive to an active RaLatch control signal received from the RaLatCtrl circuit 120. The address latch 124 includes seventeen (17) latch circuits X0-16 (e.g., bits). The state of the fourteenth (14$^{th}$) latch circuit (X13), a more significant bit, of address latch 124 is determined by control signal R2ndPump provided by RaLatCtrl circuit 120.

When refresh address GRA is latched, address circuit X13 may have an initial state (e.g., X13=0). During a first pump of a refresh operation, the initial address latched by address latch 124 is provided to the row address decoder 126 and the row associated with the initial address may be refreshed. After the first pump is completed, the RRASTD signal may transition to a state indicating a second pump, as described previously. Responsive to the indication of a second pump, the R2ndPump signal may be asserted by the RaLatCtrl circuit 120 (e.g., transitioned to an active state) in a one-shot pulse. That is, the R2ndPump signal may transition to an active state for a limited time (e.g., one clock cycle, two clock cycles). Responsive to the active R2ndPump signal, the address latch circuit X13 may be transitioned to a second state (e.g., X13=1). The new address in the address latch 124 is provided to the row address decoder 126 and the row associated with the new address is refreshed during the second pump.

As described herein, the changing of the address latch circuit X13 by the R2ndPump signal to update the latched address may allow the bank logic circuit 114 to locally generate a second row address to refresh during a subsequent pump of the refresh operation. Accordingly, refresh addresses for additional pumps need not be provided on the global row address bus 113. Although the example shown in FIG. 1 includes logic for locally generating one row address, bank logic circuit 114 could include logic for generating multiple row addresses locally, for example, when more than two pumps are performed during a refresh operation. For example, two or more address latch circuits of the address latch 124 may have states based on control signals from the RaLatCtrl (e.g., X13 and X14).

Alternatively, in place of providing the R2ndPump signal to a latch circuit (e.g., X13) of the address latch 124, non-inverted and inverted signals may be derived from the X13 latch circuit. The non-inverted signal may be provided for a first pump of a refresh operation and the inverted signal may be output in place of the non-inverted signal in response to the R2ndPump signal for a second pump of the refresh operation.

The operation of device 100 will be further described with reference to the following figures. Although the sequences and timing diagrams shown in FIGS. 2-5 are for memory bank BANK0, all memory banks of device 100, may function the same as BANK0 in some embodiments.

Figure 2A:
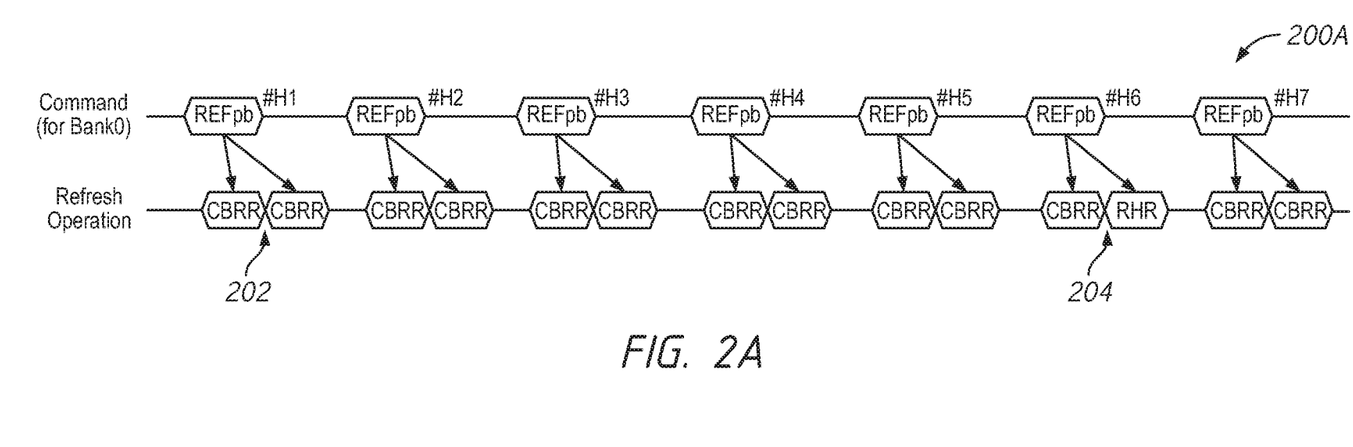
FIG. 2A is a schematic of an operation sequence of per bank refresh commands according to an embodiment of the disclosure.
Figure 2B:
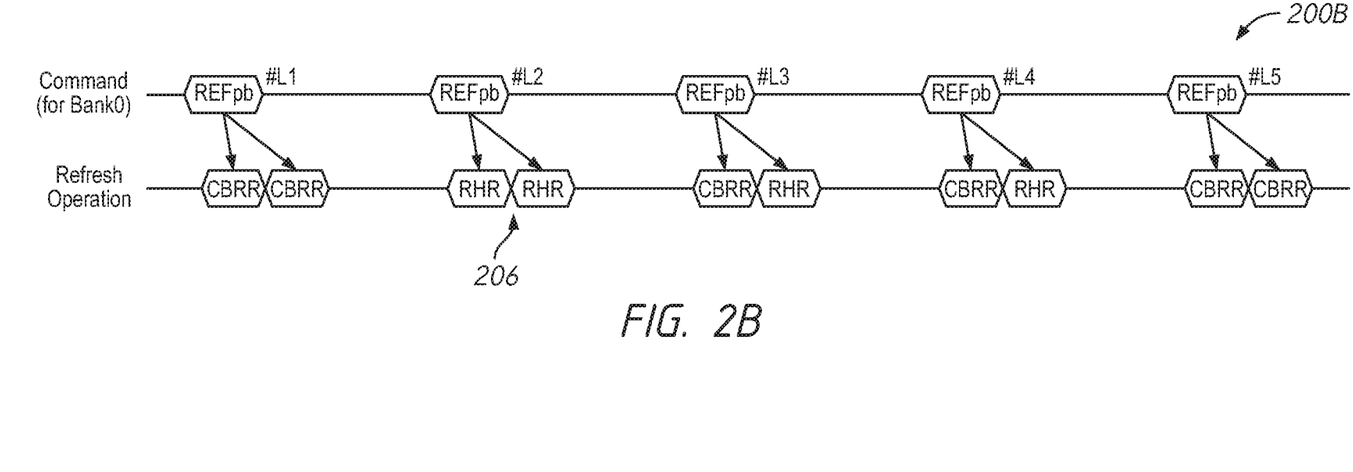
FIG. 2B is a further schematic of an operation sequence of per bank refresh commands according to an embodiment of the disclosure.

FIGS. 2A and 2B are schematic of operation sequences 200A and 200B of per bank refresh commands according to an embodiment of the disclosure. In the example shown, each refresh operation includes two pumps (e.g., word lines associated with two row addresses are refreshed). However, a refresh operation may include any number of pumps (e.g., one, three, four). A single refresh operation including multiple pumps may refresh a word line on each pump corresponding to a regular refresh operation (CBRR) based on the refresh counter 108, refresh a word line on each pump corresponding to the row hammer refresh operation (RHR) based on RHR Add_Gen 116, or some pumps may be part of a regular refresh operation while other pumps may be part of the row hammer refresh operation. Thus, a refresh operation with multiple pumps may include combinations of refresh operations. When a refresh operation includes two pumps, the refresh operations may include three combinations: CBRR-CBRR 202 mode, a CBRR-RHR 204 mode, and a RHR-RHR 206 mode. The operation sequence pattern of the three modes may be dependent on operating temperatures in some embodiments.

For CBRR-CBRR 202 mode, regular refresh operations are performed on each pump based on addresses provided on the global row address bus 113 or addressed based thereon. For CBRR-RHR 204 mode, a regular refresh operation based on an address provided on the global row address bus 113 is performed on the first pump, and a row hammer refresh operation based on an address provided by the RHR Add_Gen 116 may be performed on the second pump. For RHR-RHR 206 mode, row hammer refresh operations based on addresses provided by the RHR Add_Gen 116 may be performed on each pump of the refresh operation.

For example, when the TEMP signal provided by temperature sensor 112 takes a first state to indicate that an operating temperature is high, the refresh operation sequence pattern may be as shown in FIG. 2A. In some applications, it may be advantageous to favor refreshing data at higher temperatures because data in memory cells may degrade at a faster rate at higher temperatures. Responsive to the TEMP signal having the first state, receipt of a first per bank refresh (REFpb) commands #H1-H7 being received, refresh operations in CBRR-CBRR mode, CBRR-CBRR mode, CBRR-CBRR mode, CBRR-CBRR mode, CBRR-CBRR mode, CBRR-RHR mode and CBRR-CBRR mode may be performed, respectively. The operation sequence 200A may be repeated with respect to the subsequent REFpb commands so long as the TEMP signal is at the first state.

When the TEMP signal takes a second state to indicate that the operating temperature is low, the operation sequence pattern 200B as shown in FIG. 2B may be performed. At lower temperatures, it may be advantageous to favor refresh operations that counteract the row hammer effect because at lower temperatures, the row hammer effect may pose a greater risk to data integrity than typical DRAM data degradation at other temperatures. In response to receipt of REFpb commands #L1-L7, refresh operations in CBRR-CBRR mode, RHR-RHR mode, CBRR-RHR mode, CBRR-RHR mode and CBRR-CBRR mode may be performed, respectively. This operation sequence pattern may be repeated with respect to the subsequent REFpb commands so long as the TEMP signal is at the second state.

The sequences 200A and 200B are provided for example purposes only. It should be noted that any other sequence patterns may be set as needed. For example, the sequence during a high operating temperature (or another temperature) could be CBRR-CBRR, CBRR-RHR, CBRR-CBRR, CBRR-CBRR, CBRR-CBRR, CBRR-CBRR, CBRR-CBRR. Furthermore, as mentioned previously, the TEMP signal may have more than two states indicating additional operating temperature ranges. Additional refresh operation sequences may be provided responsive to the additional states of the TEMP signal.

Alternatively, instead of being dependent on temperature, the operation sequences 200A and 200B may be changed by fuse-option. In these embodiments, a fuse circuit may be provided in place of the temperature sensor. When the fuse circuit provides a command decoder (e.g., command decoder 104) with a control signal having a first state, the sequence pattern as shown in FIG. 2A may be executed. When the control signal from the fuse circuit has a second state, the sequence pattern as shown in FIG. 2B may be executed. In some embodiments, more than two sequences may be programmed in a memory, and two or more fuses may be used to select the desired sequence.

Figure 3:
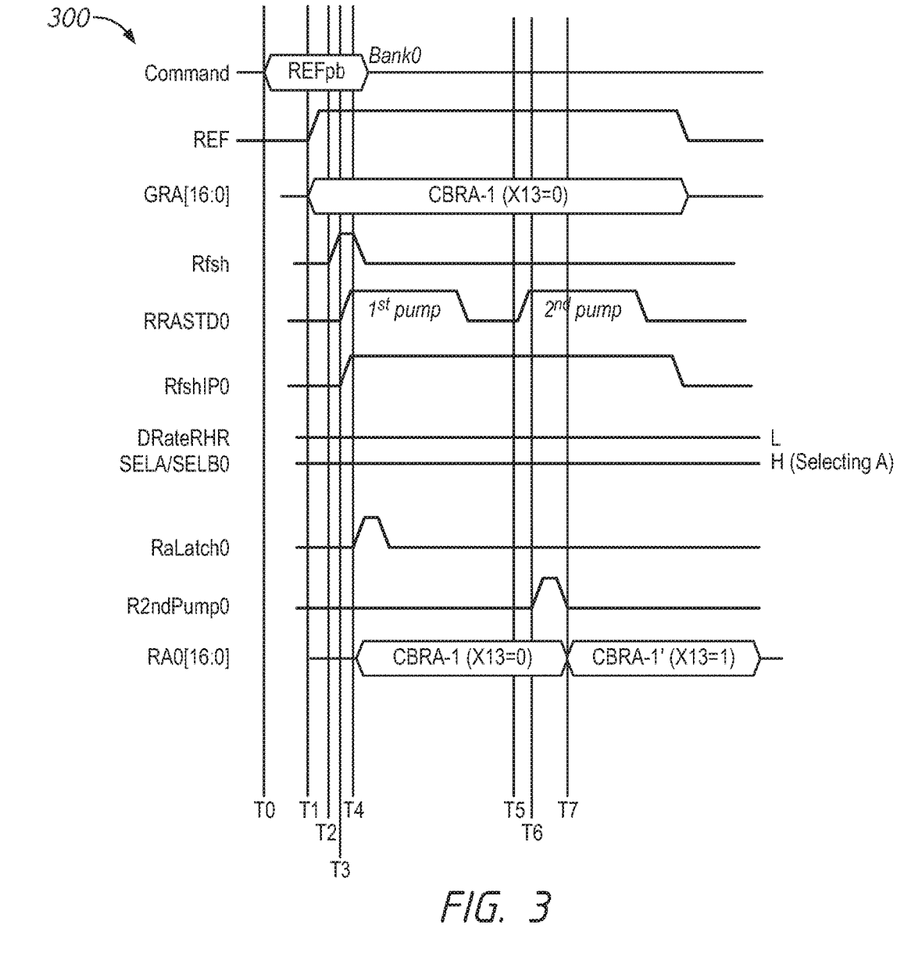
FIG. 3 is a timing diagram of a double-pump memory refresh operation according to an embodiment of the disclosure.

FIG. 3 is a timing diagram 300 of a double-pump memory refresh operation according to an embodiment of the disclosure. The timing diagram 300 may reflect the operation of device 100 during a CBRR-CBRR mode 202 refresh operation in some embodiments. For CBRR-CBRR 202 mode, regular refresh operations are performed on each pump based on addresses provided on the global row address bus 113 or addressed based thereon.

On or after T0, a per bank refresh command (REFpb) indicating a refresh operation for Bank0 may be received at the command decoder 104. On or after T1, in response to receipt of a REFpb command, the REF signal provided by the command decoder 104 may be transitioned to an active (e.g., high) state. In response to the active REF signal, the refresh row address (CBRA-1 (X13=0)) generated by the refresh counter 108, may be output by MUX1 110 and provided to the global row address bus 113 as GRA[16:0].

Further responsive to the REFpb command, the command decoder 104 may transition the Rfsh signal and the RRASTD0 signal to active (e.g., high) states on or after T2.

For a regular refresh operation, the DRateRHR signal may remain in an inactive (e.g., low) state. Responsive to the active Rfsh and RRASTD0 signals, the RFSHIP0 signal is switched to an active (e.g., high) state by the Ref circuit 118 to activate the RaLatCtrl circuit 120 on or after T3. Responsive to the activation signal, the RaLatCtrl circuit 120 transitions the RaLatch0 signal to an active (e.g., high) state on or after T4. At the same time, the SELA/SELB signal is maintained at high level to cause the MUX2 122 to output row address CBRA-1 (X13=0) from the global address bus. Responsive to the active RaLatch0 signal, address latch 124 latches row address CBRA-1 (X13=0) and the row address (RA0[16:0]) transferred from the address latch 124 to the row address decoder 126 to activate the word line designated by that address for refreshing in the memory array 128.

Upon completion of the first pump refresh on CBRA-1 (X13=0), the command decoder 104 again transitions the RRASTD0 signal to an active state on or after T5 to indicate a second pump. Responsive to the second active RRASTD0 signal, the RaLatCtrl circuit 120 asserts an active R2ndPump0 signal on or after T6. The active R2ndPump0 signal is supplied to a preset terminal of X13 latch circuit of the address latch to change its logic state from an initial state (e.g., low, "0") to a second state (e.g., high, "1") on or after T7. The output RA0 of the address latch 124 is transitioned from CBRA-1 (X13=0) to CBRA-1' (X13=1). The new row address generated responsive to the R2ndPump0 signal is provided to the row address decoder 126 to activate a word line of memory array 128 designated by CBRA-1' X13=1 for refreshing during the second pump of the refresh operation.

Figure 4:
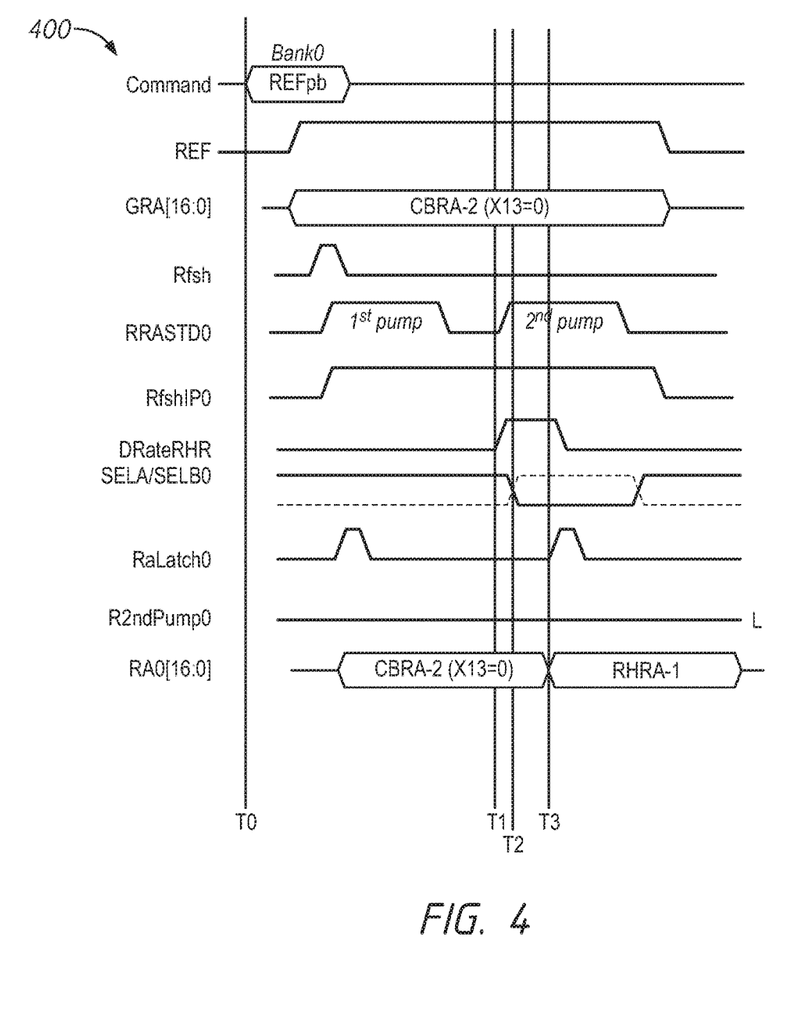
FIG. 4 is a timing diagram of a double-pump memory refresh and row hammer refresh operation according to an embodiment of the disclosure.

FIG. 4 is a timing diagram 400 of a double-pump memory refresh and row hammer refresh operation according to an embodiment of the disclosure. That is, a regular refresh operation is performed during a first pump and a row hammer refresh operation is performed during a second pump. The timing diagram 400 may reflect the operation of device 100 during a CBRR-RHR mode 204 refresh operation in some embodiments. For CBRR-RHR 204 mode, a regular refresh operation based on an address provided on the global row address bus 113 is performed on the first pump, and a row hammer refresh operation based on an address provided by the RHR Add_Gen 116 may be performed on the second pump.

In CBRR-RHR mode, from T0, the signals provided during a first pump of a refresh operation are the same as those provided during the first pump of a refresh operation as shown in timing diagram 300 of FIG. 3. However, the signals and operation of device 100 are different for the second pump. After T1, the command decoder 104 transitions the DRateRHR signal to an active state to indicate a row hammer refresh prior to transitioning the RRASTD0 signal to an active state to indicate a second pump on or after T2. Responsive to the active DRateRHR signal, the SELA/SELB signal is transitioned to low state by the RaLatCtrl circuit 120. The low SELA/SELB signal causes the MUX2 122 to output row hammer refresh address RHRA-1 received from the RHR Add_Gen 116. An active RaLatch0 signal is asserted again on or after T3 to cause the address latch 124 to latch RHRA-1 and output the row hammer refresh address as RA0 to the row decoder 126 to activate the corresponding word line of memory array 128 to perform a row hammer refresh operation. In a CBRR-RHR mode refresh operation, an active R2ndPump0 signal is not asserted. Thus, the first row address is provided by the global address bus 113 and the second row address is provided locally by the RHR Add_Gen 116.

Figure 5:
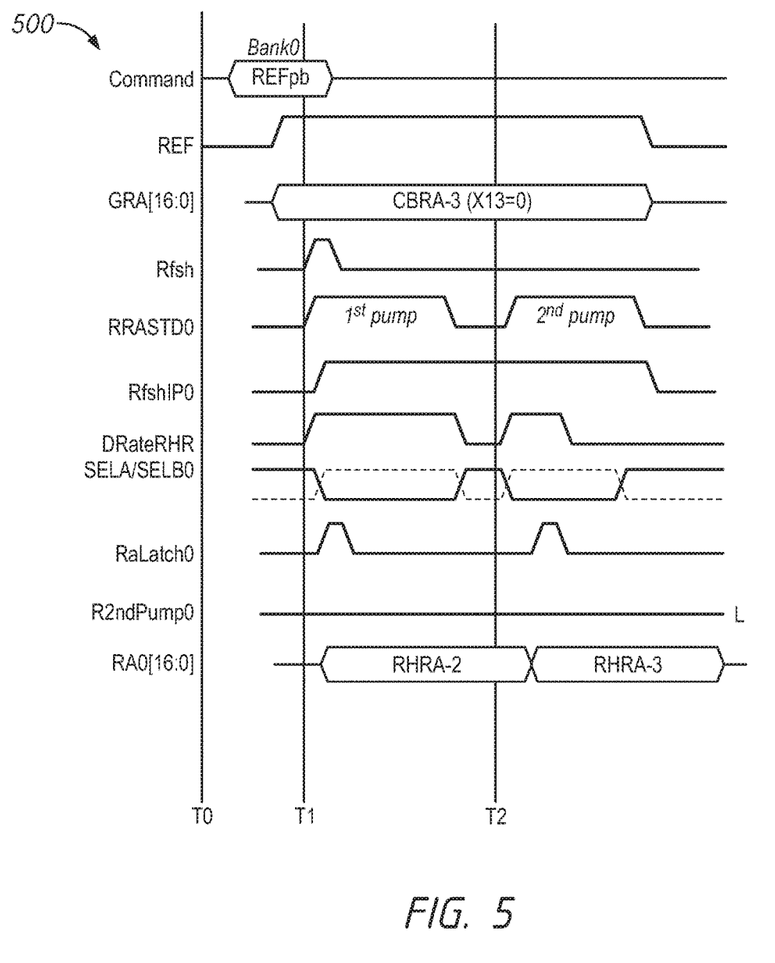
FIG. 5 is a timing diagram of a double-pump row hammer refresh operation according to an embodiment of the disclosure.

FIG. 5 is a timing diagram 500 of a double-pump row hammer refresh operation according to an embodiment of the disclosure. The timing diagram 500 may reflect the operation of device 100 during a RHR-RHR mode 206 refresh operation in some embodiments. For RHR-RHR 206 mode, row hammer refresh operations based on addresses provided by the RHR Add_Gen 116 may be performed on each pump of the refresh operation.

In RHR-RHR mode, responsive to a per bank refresh command (REFpb) received on or after T0, the command decoder 104 transitions the DRateRHR signal as well as the RRASTD0 signal to active (e.g., high) states on or after T1 for the first pump of a refresh operation. Responsive to the active DRateRHR signal, the RaLatCtrl circuit 120 transitions the SELA/SELB signal to a low logic state during the first active RRASTD0 signal. As a result of the low SELA/SELB signal, although a refresh address (RHRA-3 (X13=0)) is provided on the global row address bus 113 by the refresh address counter 108, no refresh operation based on the CBRA-3 (X13=0) is performed. Rather, responsive to the low SELA/SELB signal, the MUX2 122 provides a row hammer refresh address (RHRA-2) from the RHR Add_Gen 116 to the address latch 124 to be provided to the row decoder 126 for performing a refresh operation on the word line associated with RHRA-2.

Again, for the second pump, on or after T2, the command decoder 104 transitions DRateRHR sand RRASTD0 signals to active states. Responsive to the active DRateRHR signal, SELA/SELB is transitioned to a low state and the MUX2 122 provides a row hammer refresh address (RHRA-2) from the RHR. Add_Gen 116 to the address latch 124. The address latch 124 provides RHRA-3 to the row decoder 126 for performing a refresh operation on the word line associated with RHRA-3. In some embodiments, RHRA-2 may be an address corresponding to a first primary victim word line and RHRA-3 may be an address corresponding to a second primary victim word line. In some embodiments, RHRA-2 may be an address corresponding to a first secondary victim word line and RHRA-3 may be an address corresponding to a second secondary victim word line. In some embodiments, row hammer refresh addresses RHRA-2 and RHRA-3 may be generated by the RHR Add_Gen 116 based, at least in part, on a row address sampled from the global row address bus 113 during a non-refresh memory command.

As discussed previously, although having a global row address bus shared between memory banks saves space on a die of a memory device, delays between memory commands may need to be increased to avoid having conflicting row addresses on the global row address bus. However, because bank logic circuit 114 generates at least one refresh address and/or row hammer refresh address locally at the memory banks BANK0-7, device 100 does not need to wait for a memory bank to complete a refresh operation prior to providing to the global row address bus 113 a row address associated with a subsequent memory command.

Figure 6:
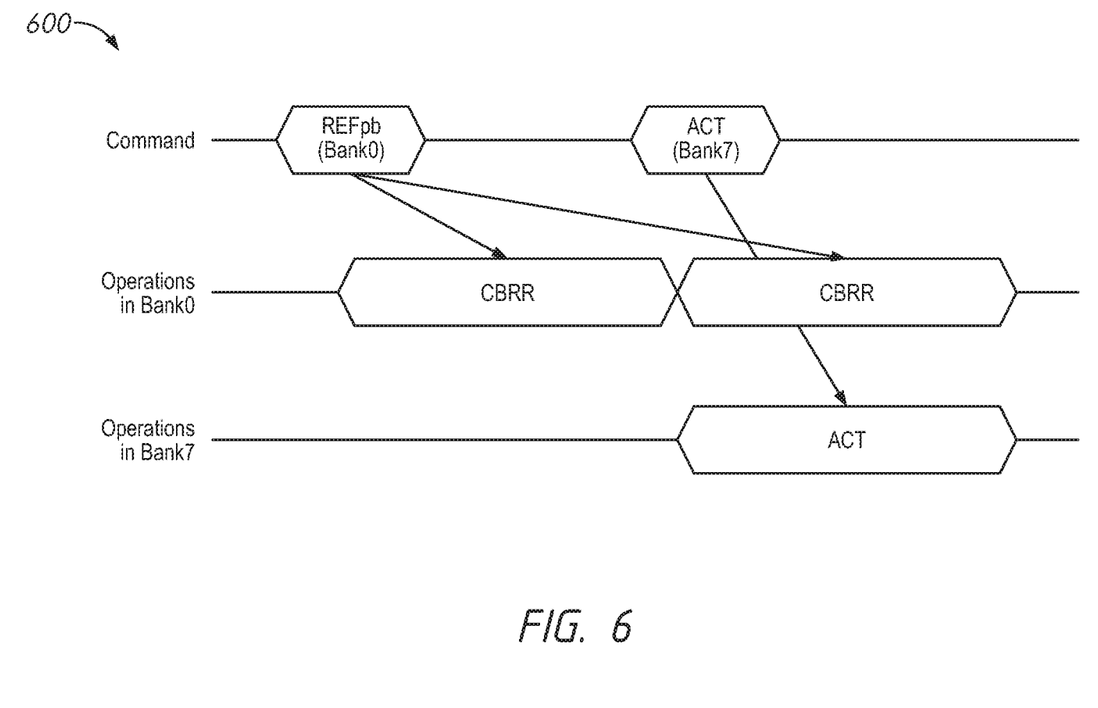
FIG. 6 is a schematic of an operation sequence of a refresh command and an activation command according to an embodiment of the disclosure.

FIG. 6 is a schematic operation sequence 600 of a refresh command and an activation command according to an embodiment of the disclosure. As shown in sequence 600, a per bank refresh command (REFpb) indicating memory bank BANK0 is received by the device 100. In response to the refresh command, memory bank BANK0 performs a double-pump refresh operation (CBRR-CBRR). Although a double-pump refresh operation is shown in the example of FIG. 6, a refresh operation with any number of pumps may be performed. Furthermore, although a CBRR-CBRR mode refresh operation is shown, any mode refresh operation may be performed. Subsequent to the refresh command being received, but prior to completion of the refresh operation for memory bank BANK0, an activation command (ACT) indicating memory bank BANK7 is received by the memory device. The row address associated with the activation command may be provided to memory bank BANK7 on the global row address bus 113 during the refresh operation of memory bank BANK0 because memory bank BANK0 does not need to receive additional refresh addresses from the global row address bus 113. Responsive to the activation command, memory bank BANK7 performs an activation operation while memory bank BANK0 continues to perform the refresh operation. Thus, the delay between memory commands may be reduced.

Figure 7:
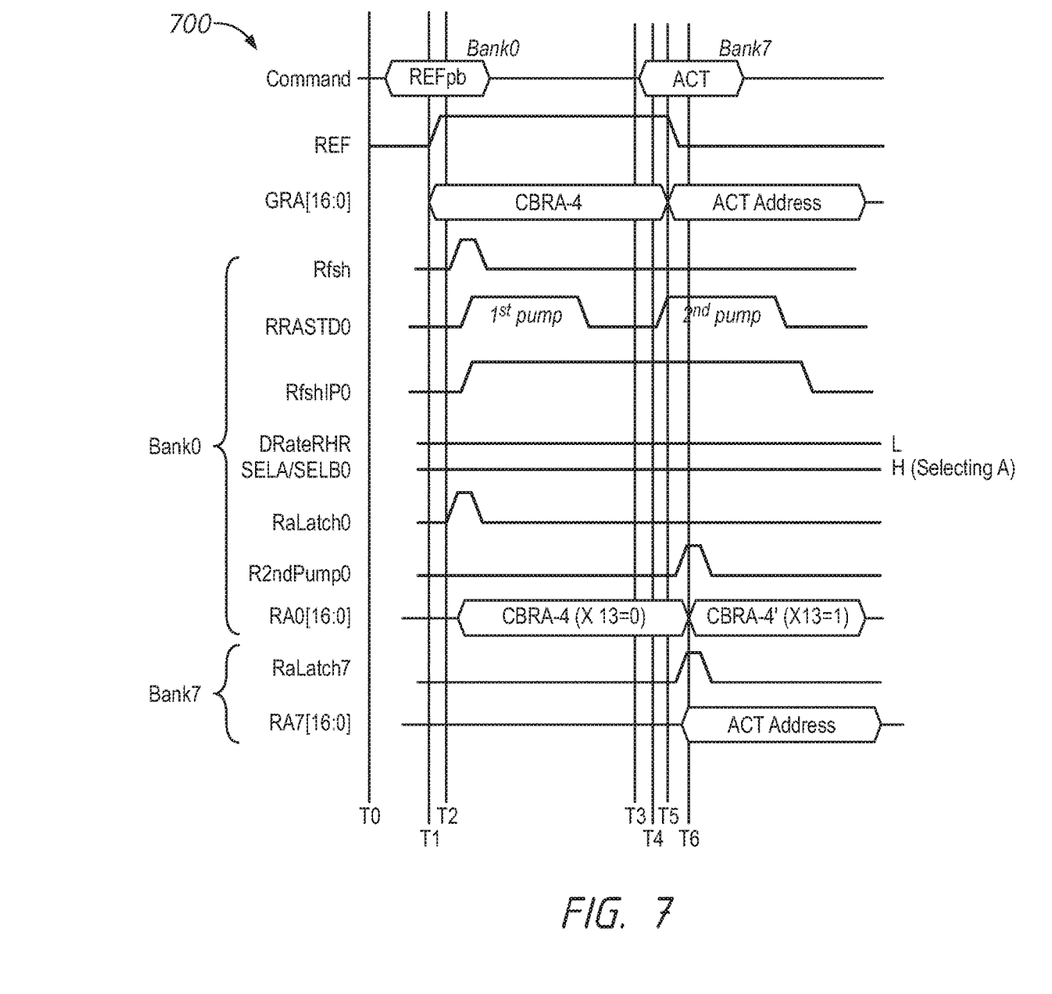
FIG. 7 is a timing diagram of the refresh command and activation command shown in FIG. 6 according to an embodiment of the disclosure.

FIG. 7 is a timing diagram 700 of the refresh command and activation command shown in FIG. 6 according to an embodiment of the disclosure. On or after T0, a per bank refresh command (REFpb) indicating memory bank BANK0 is received by the command decoder 104. Responsive to the refresh command, the command decoder 104 transitions REF signal to a high state on or after Responsive to the high REF signal, MUX1 110 outputs refresh address CBRA-4 (X13=0) from refresh counter 108 onto the global row address bus 113 (GRA). Further responsive to receipt of REFpb, command decoder 104 may provide active Rfsh and RRAST0 signals to memory bank BANK0 on or after T2. Because this is a normal refresh operation, DRateRHR may remain low. Responsive to the active Rfsh and RRASTD0 signals, the Ref circuit 118 may activate the RaLatCtrl circuit 120 via an active RfshIP0. Once activated, the RaLatCtrl circuit 120 of memory bank BANK0 may transition RaLatch0 to an active state. The RaLatCtrl circuit 120 may provide a low SELA/SELB0 signal to the MUX2 122 such that the address latch 124 will latch the CBRA-4. The refresh address CBRA-4 may be provided from the address latch 124 to the row decoder 126 and a word line associated with the address may be refreshed during a first pump of the refresh operation.

On or after T3, an activation command (ACT) indicating memory bank BANK7 is received by the command decoder 104. Responsive to the ACT command, the command decoder 104 may transition the REF signal to an inactive state. Responsive to the inactive REF signal, MUM 110 may provide a row address RR provided by the row address latch 106 to the global row address bus 113 on or after T5. Although not shown in FIG. 7, memory bank BANK7 may receive inactive Rfsh, RRASTD7, and DRateRHR signals from the command decoder 104. Responsive to the inactive control signals, the RaLatCtrl circuit 120 of memory bank BANK7, may provide an active RaLatch7 signal and a high SELA/SELB7 signal, causing address latch 124 to latch the ACT address from the global memory bus 113. Memory bank BANK7 may further receive an active Sample7 signal, causing RHR Add_Gen 116 of memory bank BANK7 to sample the ACT address from the global address line on or after T6. The ACT address may be provided to the row decoder 126 by the address latch 124, and an activation operation may be performed on a word line associated with the ACT address.

Returning to memory bank BANK0, command decoder 104 transitions RRASTD0 again to an active state indicating a second pump in the refresh operation on or after T4. For example, in some embodiments, this may occur after the activation command is received. Responsive to the active RRASTD0 signal, RaLatCtrl circuit 120 may provide an active R2ndPump0 signal to the address latch 124 on or after T5. The active R2ndPump0 signal alters the $14^{th}$ latch circuit (X13) of the address latch 124 to generate an updated refresh address: CBRA-4' (X13=4). The updated refresh address is provided to the row decoder 126 and a word line associated with the address is refreshed during the second pump of the refresh operation on or after T6.

As shown in timing diagram 700, the ACT address associated with ACT command for memory bank BANK7 may be transferred onto the global row address bus 113 because CBRA-4' (X13=1) for the second CBRR pump of the refresh operation is produced by the bank logic circuit 114 without using any row address on the global row address bus 113. Thus, no collision between CBRA and ACT addresses occurs on the global row address bus 113. Although the example of FIG. 7 shows a CBRR-CBRR mode double-pump refresh operation, there also may be no collision between memory commands and refresh commands for other refresh operation modes such as CBRR-RHR mode or RHR-RHR mode.

Figure 8A:
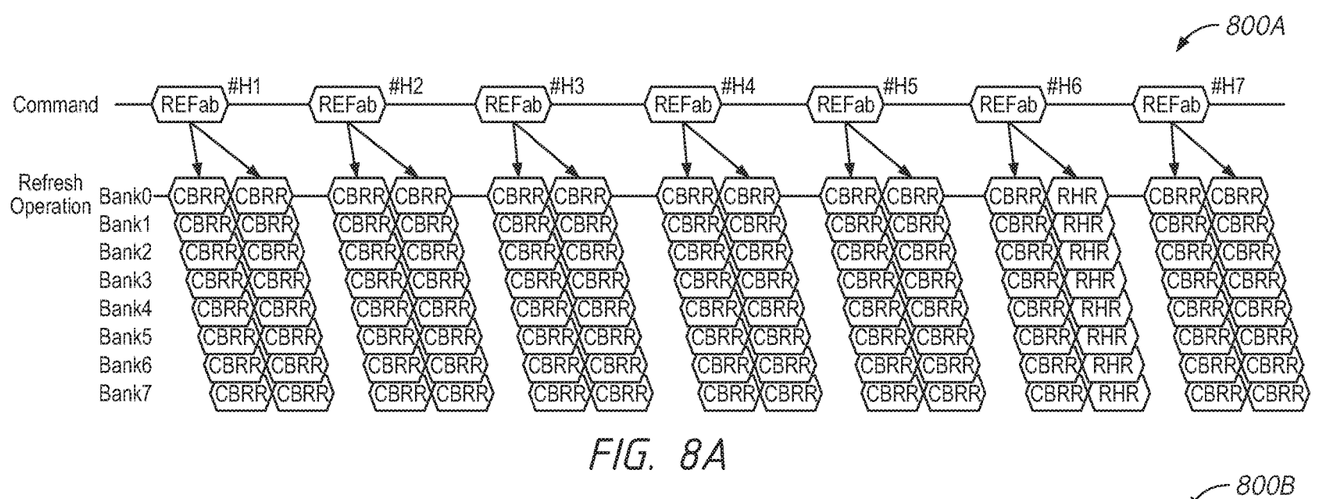
FIG. 8A is a schematic of an operation sequence of all bank refresh commands according to an embodiment of the disclosure.
Figure 8B:
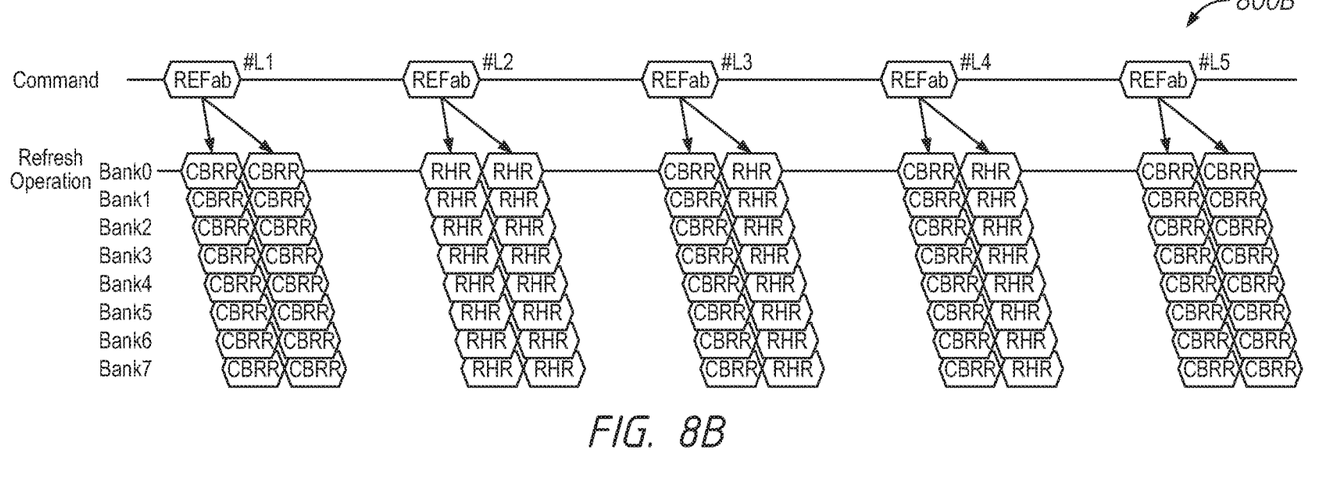
FIG. 8B is a further schematic of an operation sequence of all bank refresh commands according to an embodiment of the disclosure.

FIGS. 8A and 8B are schematics of operation sequences 800A and 800B of all bank refresh commands according to an embodiment of the disclosure. FIG. 8A shows a sequence 800A of refresh operations responsive to a plurality of refresh commands for high operating temperatures, similar to the sequence shown in FIG. 2A. FIG. 8B shows a sequence 800B of refresh operations responsive to a plurality of refresh commands for low operating temperatures, similar to the sequence shown in FIG. 2B. The refresh commands of FIGS. 8A and 8B may be all bank refresh commands (REFab). The generation of updated refresh addresses described herein with reference to per bank refresh commands may be applied to all bank refresh commands. Each memory bank BANK0-7 may operate in a similar manner as described in reference to FIGS. 1-5.

In some applications, refreshing all of the memory banks BANK0-7 in response to an all bank refresh command may cause a substantial current draw by the device 100. This current draw may be undesirable in some applications. To reduce the current draw, the refresh operations of the memory banks BANK0-7 may be performed in a time division manner. That is, the refresh operations of the memory banks BANK0-7 may be staggered over time as shown in FIGS. 8A and 8B, in some embodiments, the bank logic circuits 114 of memory banks BANK0-7 may be activated in a time division manner. In some embodiments, the command decoder 104 may delay transitioning one or more control signals to an active state to one or more bank logic circuits 114 of the memory banks BANK0-7.

Figure 9:
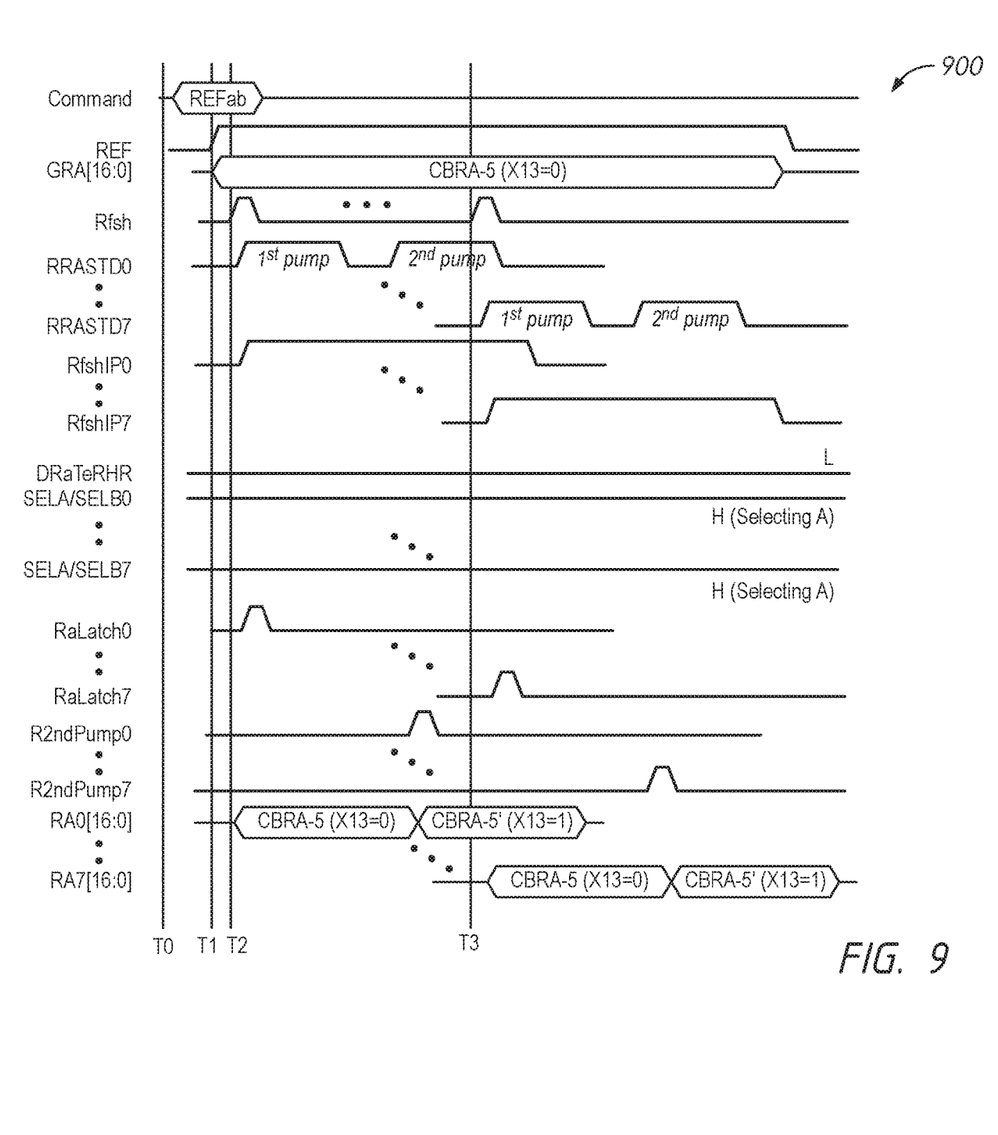
FIG. 9 is a timing diagram of an all bank refresh command according to an embodiment of the disclosure.

FIG. 9 is a timing diagram of an all bank refresh command according to an embodiment of the disclosure. An all bank refresh command (REFab) is received by the command decoder 104 on or after T0. Responsive to REFab, the command decoder 104 may provide an active REF signal to MUX1 110. In response, MUX1 110 may output a refresh address CBRA-5 (X13=0) from refresh counter 108 to the global row address bus 113 after T1. The command decoder 104 may further provide an active Rfsh signal and RRASTD0 signal on or after T2. Although the active Rfsh signal is provided to all memory banks BANK0-7, the refresh operations of the other memory banks BANK 1-7 are delayed at least because the command decoder 104 only provides an active RRASTD signal (RRASTD0) to memory bank BANK0 on or after T2. As shown in FIG. 9, memory bank BANK7 may not receive an active RRASTD7 signal until on or after T3 in some embodiments. Thus, the refresh operations of the memory banks BANK0-7 responsive to an all bank refresh command may be performed in a time division manner (e.g., staggered) to reduce current draw.

The methods and apparatuses described herein may allow for at least one refresh address and/or row hammer refresh address to be generated locally at bank logic circuit associated with a memory bank. In some embodiments, the refresh address may be generated by updating an initial refresh address received from a global row address bus. The locally generated addresses may allow memory addresses for other memory access commands to be provided on the global row address bus prior to completion of a refresh operation. This may reduce the required time between memory access operations.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a global row address bus configured to operatively convey a refresh address associated with a refresh command; and
a plurality of memory banks each coupled to the global row address bus, wherein each memory bank of the plurality of memory banks comprises:
a bank logic circuit configured, when activated, to:
temporarily latch the refresh address to provide a latched refresh address;
output the latched refresh address;
update the latched refresh address to provide an updated refresh address; and
output the updated refresh address after outputting the latched refresh address;
a memory array; and
a row address decoder coupled between the bank logic circuit and the memory array, wherein the row address decoder is configured to activate a first word line of the memory array designated by the latched refresh address and a second word line of the memo array designated by the updated refresh address.

2. The apparatus of claim 1,
wherein the refresh command is a per bank refresh command; and
wherein the bank logic circuit of a first memory bank of the plurality of memory banks is activated, the first memory bank being designated by a bank address associated with the per bank refresh command.

3. The apparatus of claim 2,
wherein the global row address bus is further configured to operatively convey an activation (ACT) address associated with an ACT command for a second memory bank of the plurality of memory banks, the ACT command being issued prior to the row address decoder of the first memory bank completing activation of the first and second word lines; and wherein the bank logic circuit of the second memory bank is configured to temporarily latch the ACT address.

4. The apparatus of claim 1,
wherein the refresh command is an all bank refresh command; and
wherein the bank logic circuits of all the plurality of memory banks are activated responsive, at least in part, to the all bank refresh command.

5. The apparatus of claim 4, wherein the bank logic circuits of all the plurality of memory banks are activated in a time division manner.

6. The apparatus of claim 1, wherein the bank logic circuit comprises an address latch and the bank logic circuit updates the latched refresh address by changing a state of an address circuit of the address latch to provide the updated refresh address.

7. The apparatus of claim 1, wherein the bank logic circuit is further configured to:
sample the global row address bus during a non-refresh command;
temporarily latch a memory address from the global address bus to provide a latched memory address; and
generate a row hammer refresh address based on the latched memory address.

8. An apparatus comprising:
a plurality of memory banks, wherein each memory bank of the plurality of memory banks comprises:
a bank logic circuit configured, when activated, to:
latch a refresh address from a global row address bus to provide a latched refresh address; and
update the latched refresh address to provide an updated refresh address;
a memory array; and
a row address decoder coupled between the bank logic circuit and the memory array; and
a command decoder coupled to the plurality of memory banks, the command decoder configured, responsive to a refresh command, to:
provide a first control signal to activate the hank logic circuit;
provide a second control signal to indicate a pump of a refresh operation; and
provide a third control signal to indicate a mode of the refresh operation.

9. The apparatus of claim 8, further comprising a temperature sensor configured to provide a temperature signal indicative of an operating temperature to the command decoder, wherein the mode of the refresh operation is based, at least in part, on the temperature signal.

10. The apparatus of claim 8, wherein the mode of the refresh operation includes a regular refresh operation on a first pump and a second pump.

11. The apparatus of claim 8, wherein the mode of the refresh operation includes a regular refresh operation on a first pump and a row hammer refresh operation on a second pump.

12. The apparatus of claim 8, wherein the mode of the refresh operation includes a row hammer refresh operation on a first pump and a second pump.

13. The apparatus of claim 8, wherein the command decoder is further configured to, responsive to a non-refresh memory command, provide a fourth control signal to cause the bank logic circuit to sample an address from the global row address bus.

14. The apparatus of claim 13, wherein the command decoder is further configured to provide a fifth control signal having a first state indicating a row hammer refresh operation and a second state indicating a regular refresh operation.

15. An apparatus comprising:
a global row address bus configured to operatively convey a refresh address associated with a refresh command;
a plurality of memory banks, wherein each memory bank of the plurality of memory banks comprises:
a bank logic circuit comprising:
an address latch including a plurality of latch circuits;
a row address latch control logic circuit configured, when activated, to provide a first control signal to cause the address latch to temporarily latch the refresh address to provide a latched refresh address and to provide a second control signal to cause the address latch to change a state of at least one of the plurality of latch circuits to provide an updated refresh address;
a memory array; and
a row address decoder coupled between the bank logic circuit and the memory array, the row address decoder configured to activate a first word line of the memory array designated by the latched refresh address and a second word line of the memory array designated by the updated refresh address.

16. The apparatus of claim 15, wherein the bank logic circuit further comprises:
a row hammer refresh address generator circuit configured to generate a row hammer refresh address; and
a multiplexer coupled to the global row address bus, the row hammer refresh address generator, and the address latch;
wherein the row address latch control logic circuit is further configured to provide a third control signal to the multiplexer, the third control signal having a first state causing the multiplexer to provide the refresh address to the address latch and a second state causing the multiplexer to provide the row hammer refresh address to the address latch.

17. The apparatus of claim 15, further comprising a command decoder coupled to the plurality of memory banks, wherein the command decoder is configured to provide an active control signal to activate the row address latch control logic circuit responsive to the refresh command.

18. The apparatus of claim 17, wherein the refresh command is an all bank refresh command and the row address latch control logic circuits of the plurality of memory banks are activated in a time division manner, wherein the time division manner is provided by the command decoder delaying the active control signal to one or more of the row address latch control logic circuits of the plurality of memory banks.

19. The apparatus of claim 17, wherein the bank logic circuit further includes a refresh progress logic circuit configured to receive the active control signal from the command decoder and the refresh progress logic circuit is further configured to activate the row address latch control logic circuit responsive to the active control signal.

20. The apparatus of claim 15, wherein the refresh command is a per bank refresh command, wherein the row address latch control logic circuit of a first bank of the plurality of memory banks is activated by the per bank refresh command;

wherein the global row address bus is further configured to provide an activation (ACT) address associated with an ACT command for a second memory bank of the plurality of memory banks, the ACT command being issued prior to the row address decoder of the first memory bank completing activation of the first and second word lines; and wherein the address latch of the second memory bank is configured to latch the ACT address.

* * * * *